US 6,608,580 B2

(12) United States Patent
Hsueh

(10) Patent No.: US 6,608,580 B2
(45) Date of Patent: Aug. 19, 2003

(54) DIFFERENTIAL ANALOG-TO-DIGITAL CONVERTER

(75) Inventor: Fu-Lung Hsueh, Cranbury, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/784,792

(22) Filed: Feb. 15, 2001

(65) Prior Publication Data

US 2002/0154049 A1 Oct. 24, 2002

(51) Int. Cl.$^7$ ................................. H03M 1/12
(52) U.S. Cl. ................ 341/155; 341/161; 341/163; 341/164
(58) Field of Search ................. 341/155, 161, 341/163, 164

(56) References Cited

U.S. PATENT DOCUMENTS

| | | | |
|---|---|---|---|
| 4,593,270 A | | 6/1986 | White |
| 4,594,576 A | * | 6/1986 | Fujii ........................ 340/347 |
| 4,812,817 A | | 3/1989 | Bernard |
| 5,038,143 A | | 8/1991 | Hester |
| 5,103,230 A | * | 4/1992 | Kalthoff et al. ............. 341/166 |
| 5,329,281 A | | 7/1994 | Baumgartner et al. |
| 5,410,310 A | | 4/1995 | Molnar |
| 5,471,208 A | * | 11/1995 | Sauer ........................ 341/120 |
| 5,479,168 A | | 12/1995 | Johnson et al. |
| 5,581,252 A | * | 12/1996 | Thomas ...................... 341/144 |
| 5,589,831 A | | 12/1996 | Knee |
| 5,598,157 A | | 1/1997 | Kornblum et al. |
| 5,661,483 A | * | 8/1997 | Negahban et al. ........... 341/161 |
| 5,706,008 A | | 1/1998 | Huntley, Jr. et al. |
| 5,764,175 A | * | 6/1998 | Pan .......................... 341/161 |
| 5,784,017 A | | 7/1998 | Craven |
| 5,870,052 A | * | 2/1999 | Dedic et al. ................ 341/161 |
| 5,880,691 A | | 3/1999 | Fossum et al. |
| 6,031,481 A | | 2/2000 | Craven |
| 6,111,529 A | | 8/2000 | Maulik et al. |
| 6,114,882 A | | 9/2000 | Flynn |
| 6,157,388 A | * | 12/2000 | Gross, Jr. ................... 341/161 |
| 6,232,908 B1 | * | 5/2001 | Nakaigawa ................. 341/160 |

* cited by examiner

*Primary Examiner*—Michael Tokar
*Assistant Examiner*—Khai M. Nguyen
(74) *Attorney, Agent, or Firm*—William J. Burke

(57) ABSTRACT

A method and system for converting a plurality of input signals being indicative of a signal to be converted to a digital output including: setting a plurality of codes each being indicative of a corresponding reference level; and, for each one of the codes, converting the one code to a first analog signal, and summing the first analog signal with a first of the input signals to provide a first summed signal; complementing the one code to provide a complemented code, converting the complemented code to a second analog signal; summing the second analog signal with a second of the input signals to provide a second summed signal corresponding to the first summed signal. The corresponding first and second summed signals are compared to provide a comparison signal. At least a portion of the digital output is set according to the comparison signal.

15 Claims, 10 Drawing Sheets

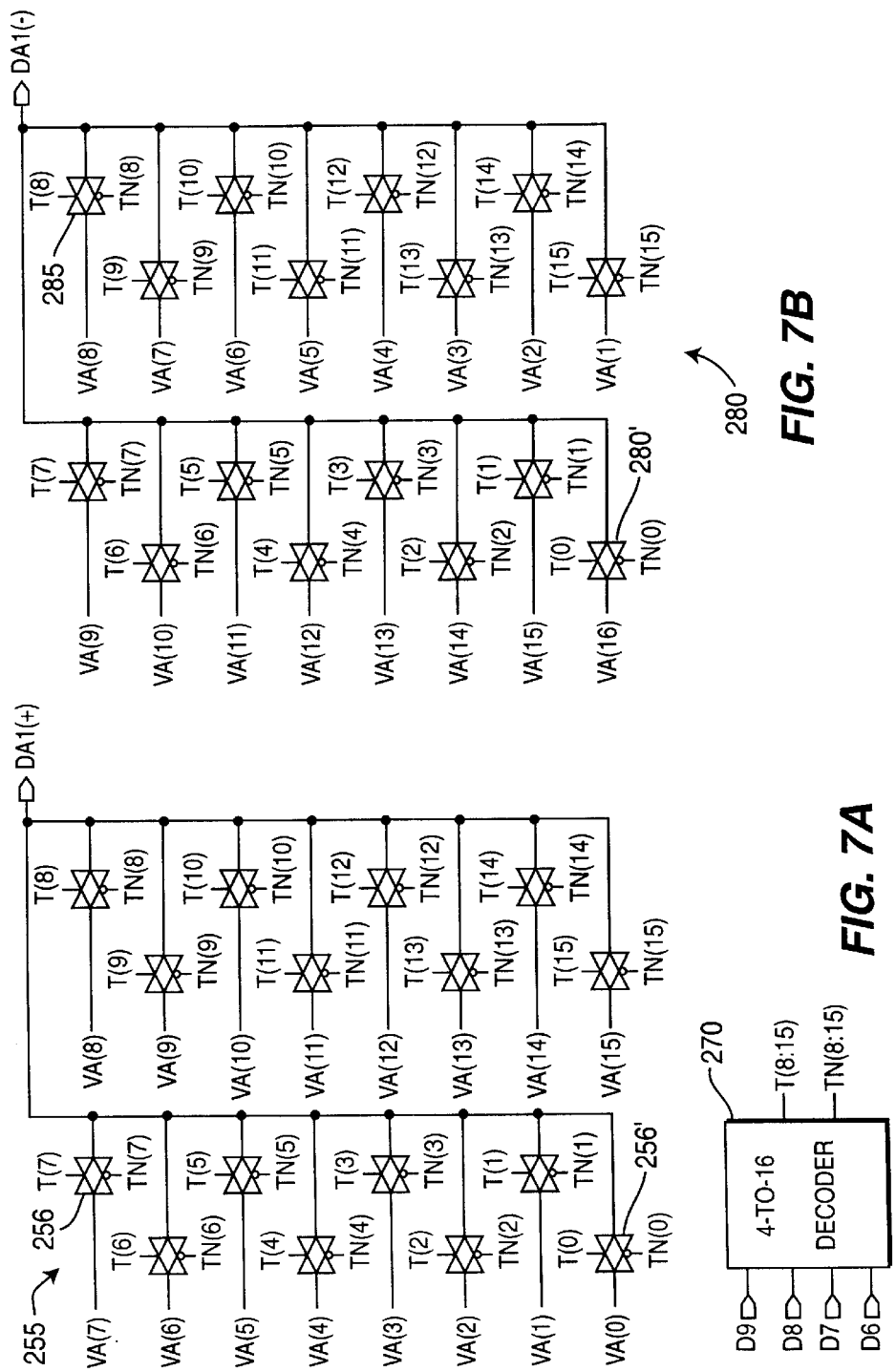

DIFFERENTIAL ANALOG-TO-DIGITAL CONVERTER

FIELD OF INVENTION

The present invention relates to analog-to-digital converters in general, and to differential analog-to-digital converters in particular.

BACKGROUND OF INVENTION

The usefulness of Analog-to-Digital Converters (ADCs) is well known. One type of ADC is known as a Successive Approximation (SSA) ADC. An SSA ADC uses a Digital-to-Analog Converter (DAC) in a feedback loop, in combination with a comparator and Successive Approximation Register (SAR). An SSA ADC first sets a Most Significant Bit (MSB) using the SAR. The comparator then compares the analog input to be converted with the DAC feedback to determine whether the input is larger or smaller than ½ the full scale reference voltage. If the input voltage is greater than ½ the reference voltage the MSB is left unchanged, otherwise it is reset to the opposite state. The analog input voltage is then reduced by the compared ½ reference voltage and compared with ½$^2$, or ¼, the reference voltage to set the next MSB. The process is continued until a desired Least Significant Bit (LSB) is set.

Traditional SSA ADCs are undesirably prone to introducing errors though, due to the inclusion of both a comparator and DAC. To address this shortcoming, differential SSA ADCs have been proposed wherein two differential inputs are provided. However, many conventional Differential SSA ADCs are relatively costly and complicated in nature. It is an object of the present invention to provide a simplfied differential SSA ADC.

SUMMARY OF INVENTION

A method for converting a plurality of input signals being indicative of a signal to be converted to a digital output including: setting a plurality of codes each being indicative of a corresponding reference level; and, for each one of the codes, converting the one code to a first analog signal, and summing the first analog signal with a first of the input signals to provide a first summed signal; complementing the one code to provide a complemented code, converting the complemented code to a second analog signal, and summing the second analog signal with a second of the input signals to provide a second summed signal corresponding to the first summed signal; comparing the corresponding first and second summed signals to provide a comparison signal; and, setting at least a portion of the digital output according to the comparison signal.

BRIEF DESCRIPTION OF THE FIGURES

FIGS. 7A and 7B illustrate diagrams of circuits suitable for use as the digital-to-analog converter DA1 of FIG. 6 according to an aspect of the present invention;

DETAILED DESCRIPTION OF THE PREFERRED EMBODIMENT

In a single input Analog-to-Digital Converter (ADC), a comparator compares an input signal ($V_{in}$) and a Digital-to-Analog Converter (DAC) output indicative of a reference level to decode digital outputs. In an N-bit Successive Approximation ADC (SSA), the comparator firstly compares $V_{in}$ with a first fixed voltage, such as ½ the Full Scale voltage (FS), to determine a first Most Significant Bit (MSB) to be output $a_{(N-1)}$, secondly compares $V_{in}-½(a_{(N-1)})$FS with ¼ FS to determine a second MSB $a_{(N-2)}$, and so on until comparing $V_{in}-½^{(N-1)}(a_{(N-1)})$FS, where I is from 1 to (N-1), to decide a Least Significant Bit (LSB) $a_{(0)}$.

For differential SSA ADC's, two input signals are provided, $V_{in+}$ and $V_{in-}$. The relationship between these inputs is characterized by $V_{in-}=FS-V_{in+}$. If the full scale value is normalized for sake of discussion, then $V_{in-}=1-V_{in+}$. In the case of analog-to-digital conversion, each input signal subtracts with a digital-to-analog feedback signal to enable the comparator to determine the decoded digital output. Assuming $DA_{(+)}$ is a digital-to-analog feedback signal corresponding to the $V_{in+}$ input and $DA_{(-)}$ is a digital-to-analog feedback signal corresponding to the $V_{in-}$ input, the inputs to the comparator take the form of $V_{in+}-DA_{(+)}$ and $V_{in-}-DA_{(-)}$. The present invention takes advantage of the following determined relationship between $DA_{(+)}$ and $DA_{(-)}$.

Figure 1:
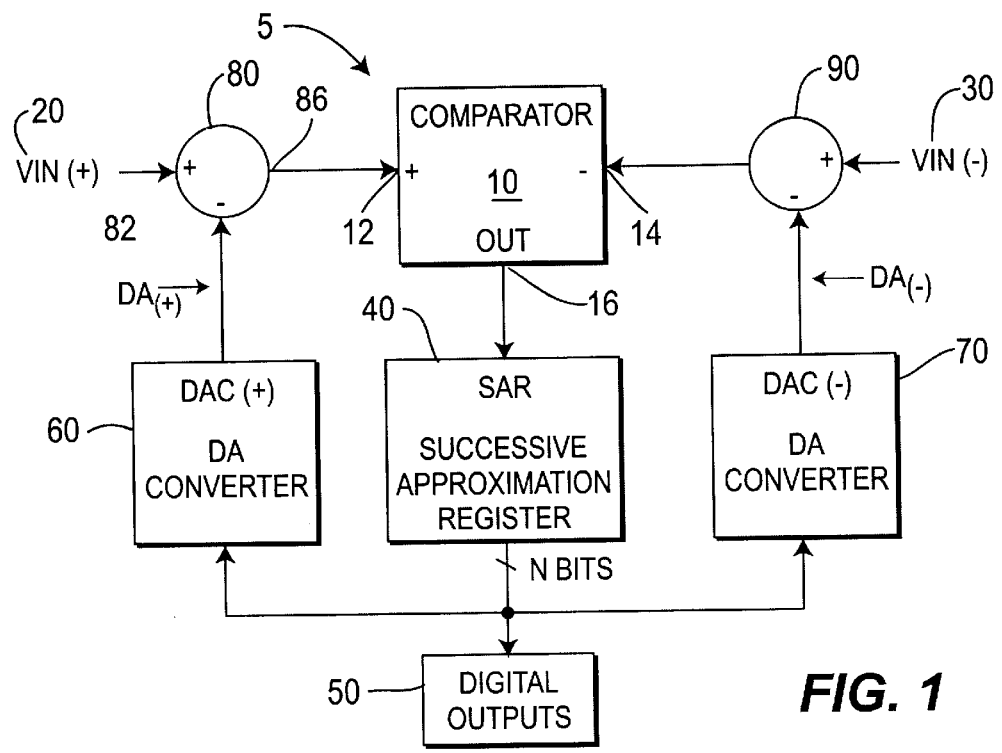
FIG. 1 illustrates a block diagram for a differential input analog-to-digital converter according to one aspect of the invention.

Referring now to the Figures, like references identify like elements of the invention. FIG. 1 illustrates a block diagram of a differential input SSA ADC 5 according to one aspect of the invention. Generally, the ADC 5 includes: a comparator 10 including a (+) input 12, (−) input 14 and output 16; a (+) input 20 for receiving $V_{in+}$ and a (−) input 30 for receiving $V_{in-}$. Coupled to the output 16 is a Successive Approximation Register (SAR) 40. Coupled to an output of the SAR 40 are digital outputs 50 and Digital-to-Analog Converters (DACs) 60, 70. A (+) summing circuit or summer 80 includes a (+) input 82, a (−) input 84 and an output 86. The input 82 is coupled to input 20, while input 84 is coupled to output of DAC 60 and output 86 is coupled to comparator 10 input 12. A (−) summing circuit or summer 90 includes a (+) input 92, a (−) input 94 and an output 96. The input 92 is coupled to input 30, while input 94 is coupled to an output of DAC 70 and output 96 is coupled to comparator 10 input 14. The DAC 60 produces the $DA_{(+)}$ signal while the DAC 70 produces the $DA_{(-)}$ signal. Hence, comparator 10 input 12 receives $V_{in+}-DA_{(+)}$ and comparator 10 input 14 receives $V_{in-}-DA_{(-)}$. $DA_{(+)}$ and $DA_{(-)}$ normalized with digital codes and voltage amplitude such that in the analog domain they do not exceed 1 in normal operation.

The ADC 5 receives the differential signals $V_{in+}$ and $V_{in-}$ at the inputs 20, 30, i.e.

$$V_{in+}-DA_{(+)}=-[V_{in-}-DA_{(-)}] \qquad (1)$$

By substituting: $V_{in+}+V_{in-}=1$ into Eq. 1, due to normalization, $DA_{(-)}=[1-DA_{(+)}]=[FS-DA_{(+)}]$ in the analog domain, or, $$DA_{(-)}=2\text{'s complement of } DA_{(+)}, \text{ in the digital domain.} \qquad (2)$$

In the digital domain, for an N-bit ADC, $$DA_{(+)} = a_{(N-1)}\frac{1}{2} + a_{(N-2)}\frac{1}{4} + a_{(N-3)}\frac{1}{8} + \ldots + a_{(1)}\left(\frac{1}{2}\right)^{N-1} + a_{(0)}\left(\frac{1}{2}\right)^{N},$$

or $$1 = \left[\frac{1}{2} + \frac{1}{4} + \frac{1}{8} + \frac{1}{16} + \ldots + \left(\frac{1}{2}\right)^{N-1} + \left(\frac{1}{2}\right)^{N}\right] + \left(\frac{1}{2}\right)^{N},$$

where $a_{(1)}$ can be 0 or 1, so $$DA_{(-)} = 1 - DA_{(+)} \qquad (3)$$

$$= 1 - \left\{ a_{(N-1)}\frac{1}{2} + a_{(N-2)}\frac{1}{4} + a_{(N-3)}\frac{1}{8} + \ldots + a_{(1)}\left(\frac{1}{2}\right)^{N-1} + a_{(0)}\left(\frac{1}{2}\right)^{N} \right\}$$

$$= [1 - a_{(N-1)}]\frac{1}{2} + [1 - a_{(N-2)}]\frac{1}{4} + [1 - a_{(N-3)}]\frac{1}{8} + \ldots + [1 - a_{(1)}]\left(\frac{1}{2}\right)^{N-1} + [1 - a_{(0)}]\left(\frac{1}{2}\right)^{N} + \left(\frac{1}{2}\right)^{N}$$

$$= [\text{inverse of } DA_{(+)}] + \left(\frac{1}{2}\right)^{N}$$

Thus, for a case as $DA_{(+)}=0000\ 0000\ 0000\ 0000$, the lowest possible voltage in a 12-bit ADC, $DA_{(-)}=1111\ 1111\ 1111\ 1111+0000\ 0000\ 0000\ 0001=1\ 0000\ 0000\ 0000\ 0000$, the highest full range voltage, remembering that the 2's complement of a binary number N=(1's complement of N)+$1_{LSB}$. And, for a case where $DA_{(+)}=1111\ 1111\ 1111\ 1111$, the highest code which is one LSB below the full voltage range in a 12-bit ADC, $DA_{(-)}=0000\ 0000\ 0000\ 0001$, one LSB above the lowest voltage.

Figure 2:
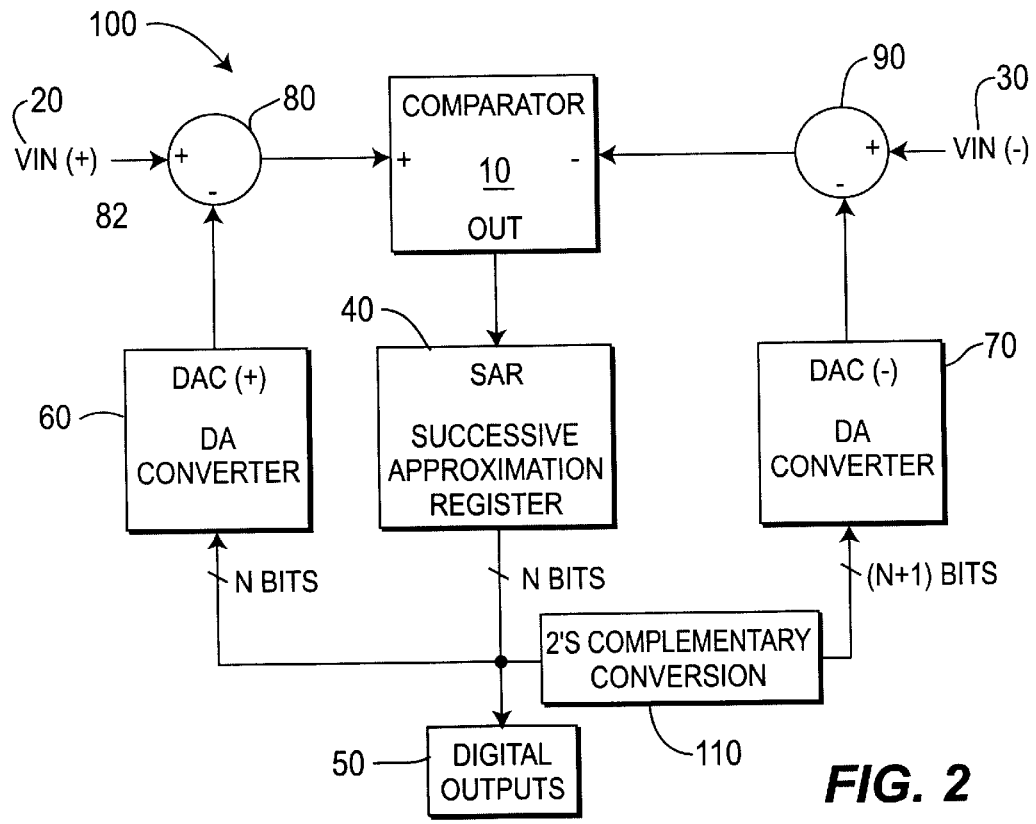
FIG. 2 illustrates a block diagram of a differential input analog-to-digital converter according to another aspect of the invention.

Thus in any N-bit ADC according to the present invention, using Eq. 2, the ADC circuit of FIG. 1 can be realized as is illustrated in FIG. 2 using a simple 2's complementary conversion circuit at the output of SAR 40 in combination with DAC 70 to provide the $DA_{(-)}$ signal according to an aspect of the present invention. Referring now also to FIG. 2, there is shown a block diagram for a differential input SSA ADC 100 according to an aspect of the invention.

Still referring to FIG. 2, there is shown the ADC of FIG. 1 now also illustrating a 2's complementary conversion circuit 110 coupled between the SAR 40 and DAC 70. Thus, $DA_{(-)}$ which is the 2's complement of $DA_{(+)}$, is provided as an input to the DAC 70. The 2's complementary circuit 110 has a carry out bit as the MSB, i.e. is has (N+1) bits.

Figure 3:
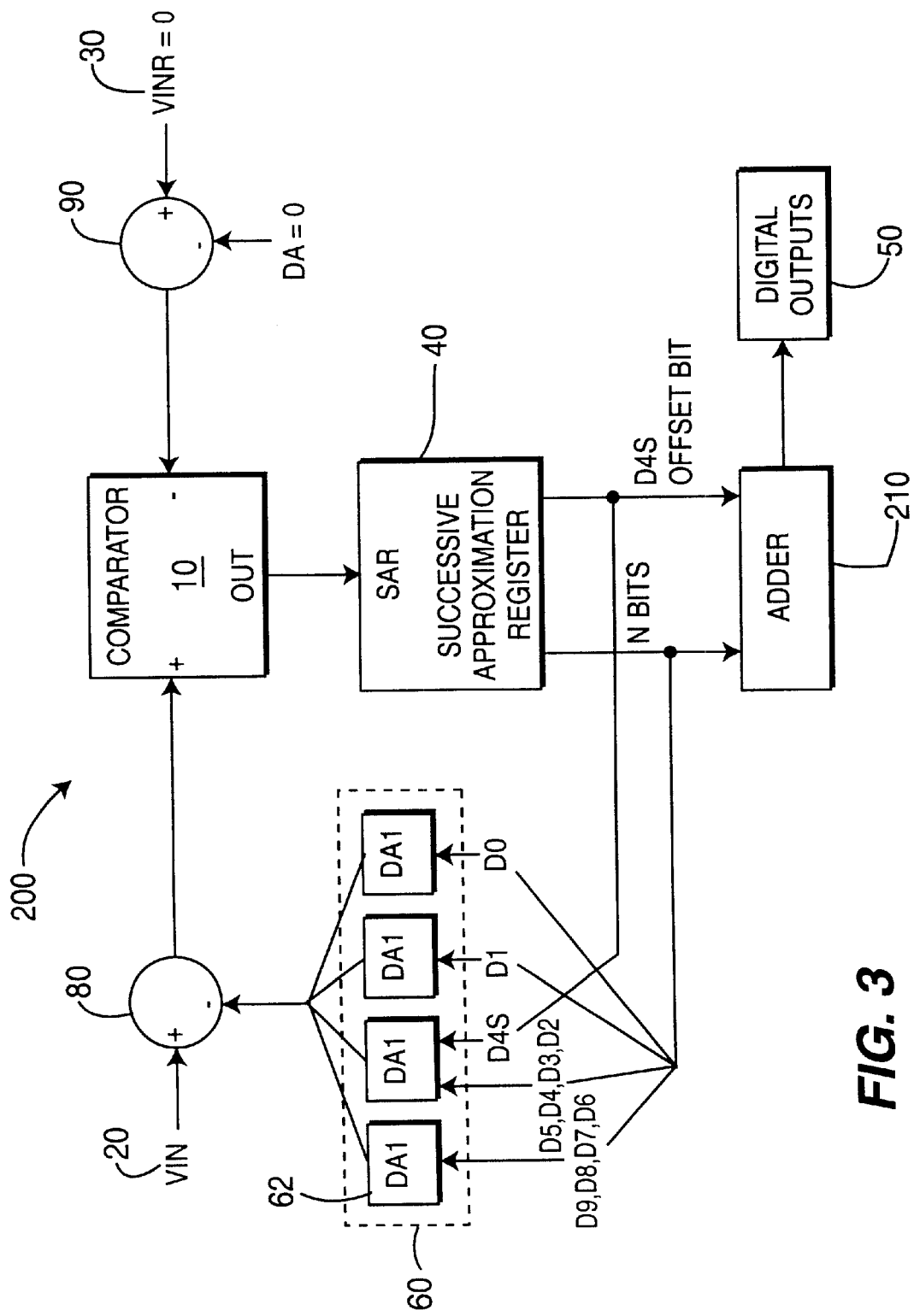
FIG. 3 illustrates a block diagram of a successive approximation analog-to-digital converter according to yet another aspect of the present invention.

The relationship between $DA_{(+)}$ and $DA_{(-)}$ in Eq. 2 is valid for differential ADC's using different types of digital-to-analog conversion schemes. According to another aspect of the present invention, the digital codes supplied at the output of the SAR 40 are decomposed into groups of DACs and then summed through a network of ratio capacitors and resistor ladders to achieve a correct weighting for the individual components and analog voltage level. Referring now also to FIG. 3, there is shown a 10-bit SSA ADC 200 block diagram according to an aspect of the present invention. Like elements to those described with reference to the previous figures will not be again described. The ADC 200 illustrated therein uses pseudo differential inputs $V_{IN}$ 20 and $V_{INR}$ 30', where $V_{IN}$ 20 is a real analog input signal to be converted and $V_{INR}$ 30' is a DC or zero value at the lowest analog input voltage.

Referring still to FIG. 3, the DAC 60 is decomposed into four (4) smaller DACs 62: $DA_1$, $DA_2$, $DA_3$ and $DA_4$. $DA_1$ processes four bits, $DA_2$ processes four bits plus one offset bit, $DA_3$ processes 1 bit and $DA_4$ processes 1 bit according to another aspect of the invention. Further, adder 210 is interposed between SAR 40 and digital outputs 50.

Figure 4:
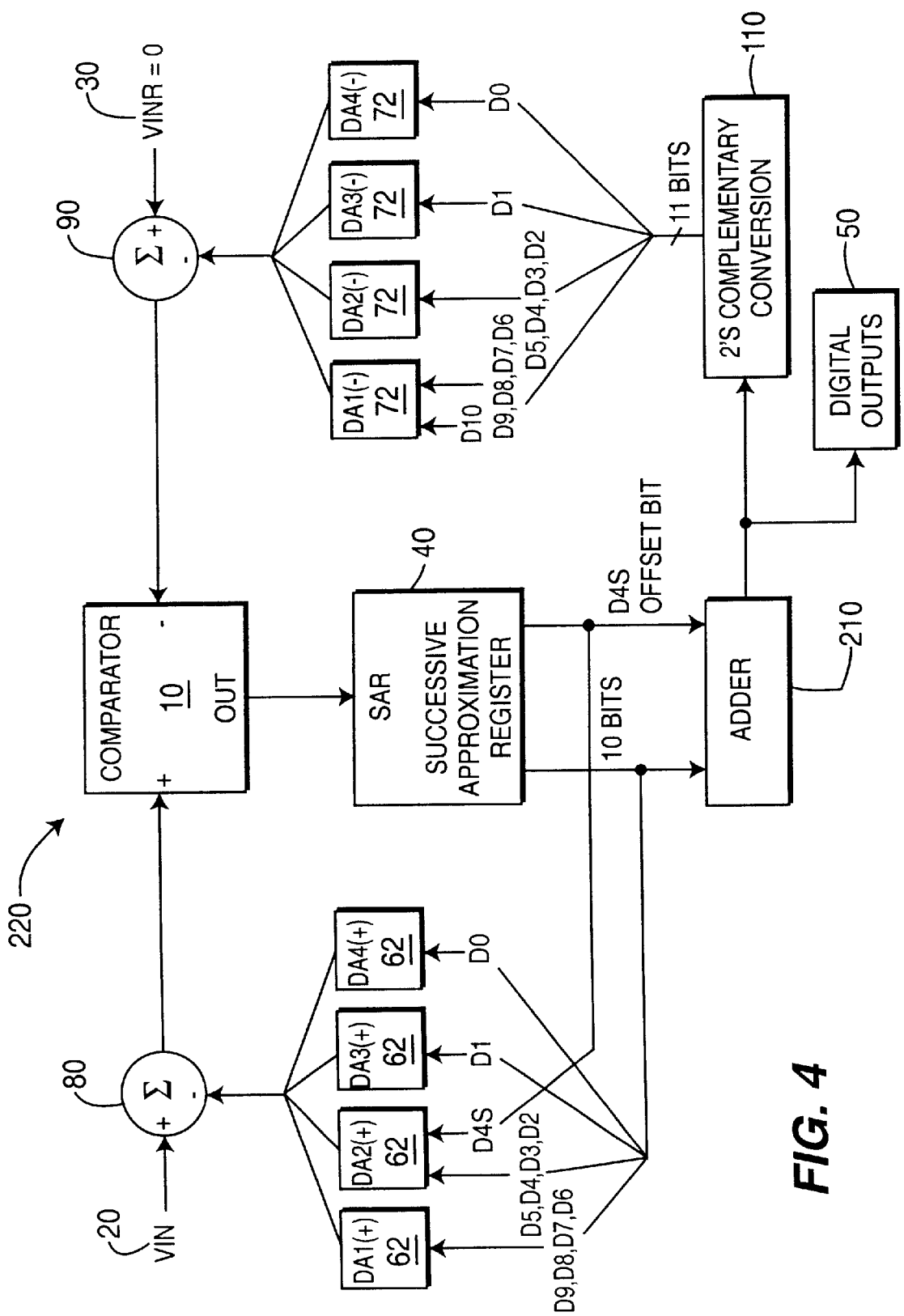
FIG. 4 illustrates a block diagram of a successive approximation analog-to-digital converter according to yet another aspect of the present invention.

Referring now to FIG. 4, there is shown a 10-bit SSA ADC 220 according to another aspect of the present invention. Again, like elements to those described with reference to the previous figures will not be again described. Separate decoding circuits 62 and 72'' are provided for the differential inputs 20, 30, respectively. $DA_{(+)}$ is again decomposed into four DACs 62: $DA_{1(+)}$, $DA_{2(+)}$, $DA_{3(+)}$ and $DA_{4(+)}$, analogously to the SSA 200 of FIG. 3. $DA_{(-)}$ is also decomposed into four DACs 72: $DA_{1(-)}$, $DA_{2(-)}$, $DA_{3(-)}$ and $DA_{4(-)}$. Again, $DA_{(-)}$ is the 2's complementary input of $DA_{(+)}$ (See EQ.2).

Still referring to FIG. 4, an offset bit $D_{4S}$ is added to $DA_{(+)}$, such that $DA'_{(+)}=DA_{(+)}+D_{4S}$. Equation (2) remains applicable, such that $DA'_{(-)}=1-DA'_{(+)}=1-[DA_{(+)}+D_{4S}]=[1-DA_{(+)}]-D_{4S}$. $DA_{1(+)}$ is a four bit decoder, $DA_{2(+)}$ is a five bit decoder, while $DA_{3(+)}$ and $DA_{4(+)}$ are one bit decoders. $DA_{1(+)}$ receives the four MSBs: $D_9$, $D_8$, $D_7$, $D_6$ output from SAR 40. $DA_{2(+)}$ receives the next four MSBs: $D_5$, $D_4$, $D_3$, $D_2$ and the offset bit $D_{4S}$ output from SAR 40. $DA_{3(+)}$ receives the second LSB $D_1$, while $DA_{4(+)}$ receives the LSB $D_0$ output from SAR 40. $DA_{1(-)}$ is a 5 bit decoder, $DA_{2(-)}$ is a 4 bit decoder, while $DA_{3(-)}$ and $DA_{4(-)}$ are one bit decoders. $DA_{1(-)}$ receives the four MSBs: $D_9$, $D_8$, $D_7$, $D_6$ and bit $D_{10}$ output from SAR 40. $DA_{2(-)}$ receives the next four MSBs: $D_5$, $D_4$, $D_3$, $D_2$ output from SAR 40. $DA_{3(-)}$ receives the second LSB $D_1$, while $DA_{4(-)}$ receives the LSB $D_0$ output from SAR 40. Adder 210 serves to account for offset bit $D_{4S}$ being parsed from the output of SAR 40.

Figure 5:
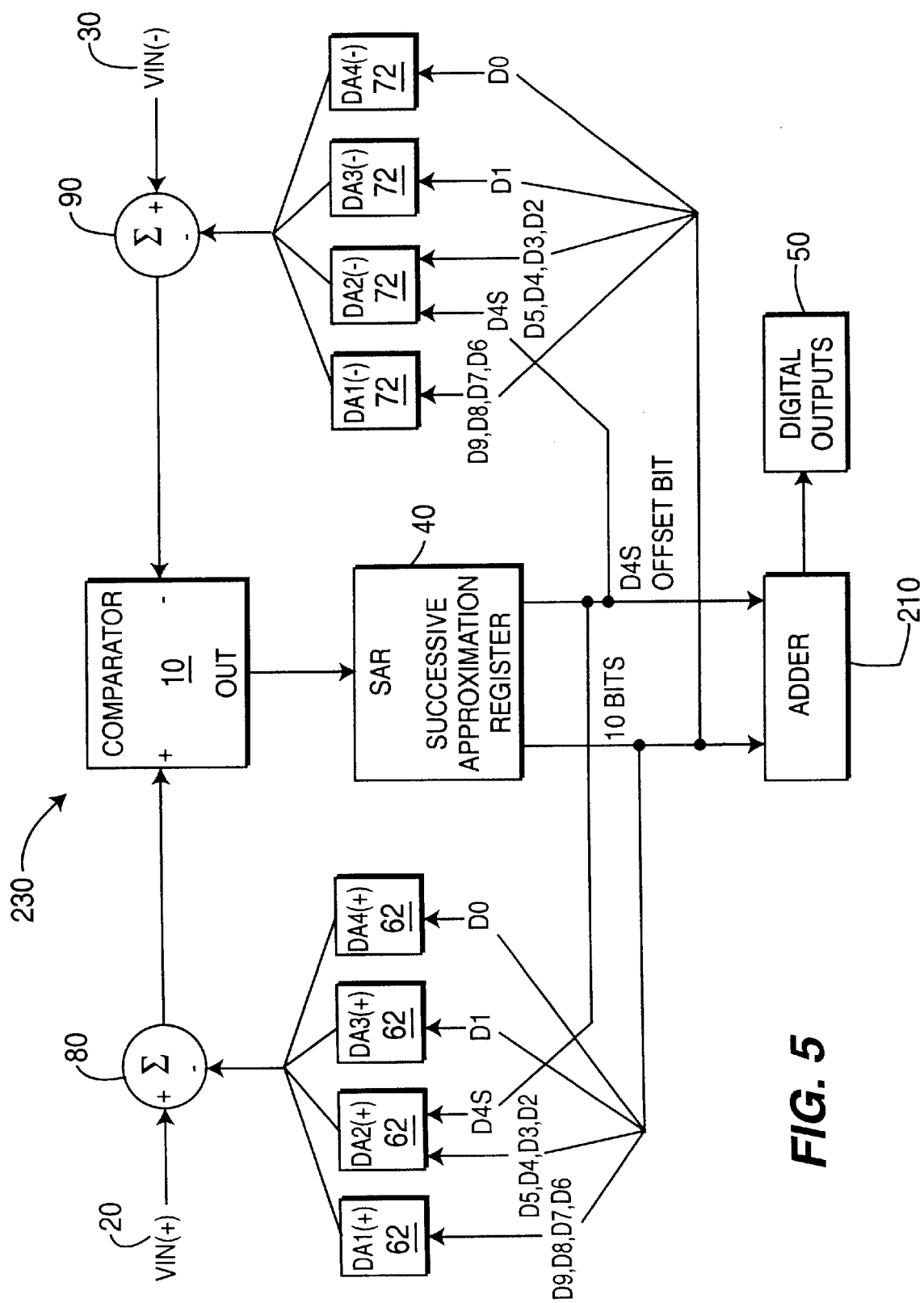
FIG. 5 illustrates a block diagram of a successive approximation analog-to-digital converter according to yet another aspect of the present invention.

Referring now to FIG. 5, there is shown an SSA ADC 230 according to yet another aspect of the present invention. Again, like elements to those described with reference to the previous figures will not be again described. A single decoder circuit is used therein for driving the $DA_{(+)}$ and $DA_{(-)}$ DACs 62, 72. Basically, the $DA_{(+)}$ DAC is decomposed into four DACs 62: $DA_{1(+)}$, $DA_{2(+)}$, $DA_{3(+)}$ and $DA_{4(+)}$ 62'. In mathematical expression this yields:

$$DA_{(+)}=(a_9,a_8,a_7,a_6,0,0,0,0,0,0)+(0,0,0,0,a_5,a_4,a_3,a_2,0,0)+(0,0,0,0,0,0,0,0,a_1,0)+(0,0,0,0,0,0,0,0,0,0,a_0)$$

$$=GP_{1(+)}+GP_{2(+)}+GP_{3(+)}+GP_{4(+)}$$

The 2's complement of $DA_{(+)}$ is $DA_{(-)}$ (See EQ.2), and $DA_{(-)}=1-DA_{(+)}$. Hence, $$DA_{(-)}=(1-a_9,1-a_8,1-a_7,1-a_6,0,0,0,0,0,0)+(0,0,0,0,1-a_5,1-a_4,1-a_3,1-a_2,0,0)+(0,0,0,0,0,0,0,0,1-a_1,0)+(0,0,0,0,0,0,0,0,0,0,1-a_0)+(0,0,$$

0,0,0,0,0,0,0,1) (4)

$$=GP_{1(-)}+GP_{2(-)}+GP_{3(-)}+GP_{4(-)}$$

Where $a_0=0$, $GP_{4(-)}=(0,0,0,0,0,0,0,1,0)$. So, $GP_{4(31)}$ has a range of (0,0,0,0,0,0,0,0,0,1) to (0,0,0,0,0,0,0,0,1,0). In the $DA_4$ decoder, the $a_0 =0$ selects V=0 for $DA_{4(+)}$ and V=V4 (1,0) for $DA_{4(-)}$. Further, $a_0=1$ selects V=V4(0,1) for DA4 (+) and DA4(−). Thus, the same decoder can be used for both DA4(+) and DA4(−). It should be noted that V4(1,0) is twice the value of V4(0,1), and V4(0,0) is 0V. Further, in this case V4(0,1) is 1/1024 the full voltage range of the ADC.

Where $a_0=0$ and $a_1=0$, $GP_{3(-)}=(0,0,0,0,0,0,0,1,0,0)$. Where $a_0=0$, $a_1=1$, $GP_{3(-)}=(0,0,0,0,0,0,0,0,1,0)$. Accordingly, $GP_{3(-)}$ ranges from (0,0,0,0,0,0,0,1,0) to (0,0,0,0,0,0,0,1,0,0). In the $DA_3$ decoder, the $a_1=0$ selects V=0 for $DA_{3(+)}$ and V=V3(1,0) for $DA_{3(-)}$; while $a_1=1$ selects V=V3(0,1) for $DA_{3(+)}$ and $DA_{3(-)}$. Thus, a same decoder can be used for both $DA_{3(+)}$ and $DA_3(-)$. V3(1,0) is twice V3(0,1), and V3(0,0) is 0V and V3(0,1) is 1/512 the full voltage range of the ADC.

Where $a_0=a_1=0$, and $a_2=a_3=a_4=a_5=0$, $GP_{2(-)}=(0,0,0,1,0,0,0,0,0,0)$. Where $a_0=0$, $a_1=0$, and $a_2=a_3=a_4=a_5=1$, $GP_{2(-)}=(0,0,0,0,0,0,0,1,0,0)$. Hence, $GP_{2(-)}$ ranges from (0,0,0,0,0,0,0,1,0,0) to (0,0,0,1,0,0,0,0,0,0). As $DA_2$ is a four bit decoder, at $a_2=a_3=a_4=a_5=0$, the decoded output selects V=0 for $DA_2$ (+) and V=V2(1,0,0,0,0) for $DA_{2(-)}$. While at $a_2=a_3=a_4=a_5=1$, the decoded output selects V=V2(1,1,1,1) for $DA_2(+)$ and V=V2(0,0,0,1) for $DA_{2(-)}$. Thus, a same decoder can be used for both $DA_{2(+)}$ and $DA_{2(-)}$. V2(1,0,0,0,0) is 16 times the value of V2(0,0,0,1). V2(1,1,1,1) is 15 times the value of V2(0,0,0,1), and V2(0,0,0,0) is 0V. V2(0,0,0,1) is 1/256 the full scale voltage range of the ADC.

It should be noted that when an offset bit $a_{4S}$ is added into $DA_{2(+)}$, the carry bit from this summation does not change the original $DA_{1(+)}$. So, the new $DA_{2'(+)}$ has the same maximum value of (1,0,0,1,1) if $a_{4S}=(0,1,0,0)$. The new range of new $DA_{2'(+)}$ in this particular case is (1,0,1,0,0) instead of (1,0,0,0,0). Hence, $$DA_{2'(-)}=[(1,0,1,0,0)-DA_{2(+)}-a_{4S}]$$

$$=[(1,0,0,0,0)-DA_{2(+)}]+(0,0,0,0)-a_{4S}$$

$$=DA_{2(-)}+(0,1,0,0)-a_{4S},$$

where $a_{4S}$ is a simplified expression for $(0,a_{4S}, 0,0)$.

Thus, where $a_{4S}=(0,1,0,0)$, $DA_{2'(-)}=DA_{2(-)}$, $DA_{2'(+)}=DA_2$ (+)+(0,1,0,0). And, where $a_{4S}=(0,0,0,0)$, $DA_{2'(-)}=DA_{2(-)}+(0,1,0,0)$, and $DA_{2'(+)}=DA_{2(+)}$. Thus, a decoding circuit used in connection with $DA_{2(+)}$ with an offset bit can be used for $DA_{2'(+)}$ and $DA_{2'(-)}$ as well. In this case, the decoded output of (0,0,0,0) in $DA_{2'(+)}$ selects V=0, and selects V=V2(1,0,1,0,0) in $DA_{2'(-)}$. The decoded output of (1,0,0,1,1) selects V=V2(1,0,0,1,1) for $DA_{2'(+)}$ and selects V=V2(0,0,0,1) for $DA_{2'(-)}$. V2(1,0,1,0,0) is 20 times the value of V2(0,0,0,1). V2(1,0,0,1,1) is 19 times the value of V2(0,0,0,1) and V2(0,0,0,0) is 0V. V2(0,0,0,1) is 1/256 the full scale voltage range of the ADC.

Where a0=a1=a2=a3=a4=a5=0, and a6=a7=a8=a9=0, GP1(−)=(1,1,1,1,1,1,1,1,1,1)+(0,0,0,0,0,0,0,0,0,1)=(1,0,0,0,0,0,0,0,0,0,0), an 11-bit code. Where a0=a1=a2=a3=a4=a5=0 and a6=a7=a8=a9=1, GP1(−)=(0,0,0,1,0,0,0,0,0,0). Accordingly, Gp1(−) ranges from (0,0,0,1,0,0,0,0,0,0) to (1,0,0,0,0,0,0,0,0,0,0). DA1 uses a four-bit decoder, where a6=a7=a8=a9=0 the decoded output selects V=0 for DA1(+) and V=V1(1,0,0,0,0) for DA1(−). Where a6=a7=a8=a9=1, the decoded output selects V=V1(1,1,1,1) for DA1(+) and V=V1(0,0,0,1) for DA1(−). Thus, a same decoder can be used for both DA1(+) and DA1(−). V1(1,0,0,0,0) is 1/16 the full scale voltage range of the ADC.

Figure 6:
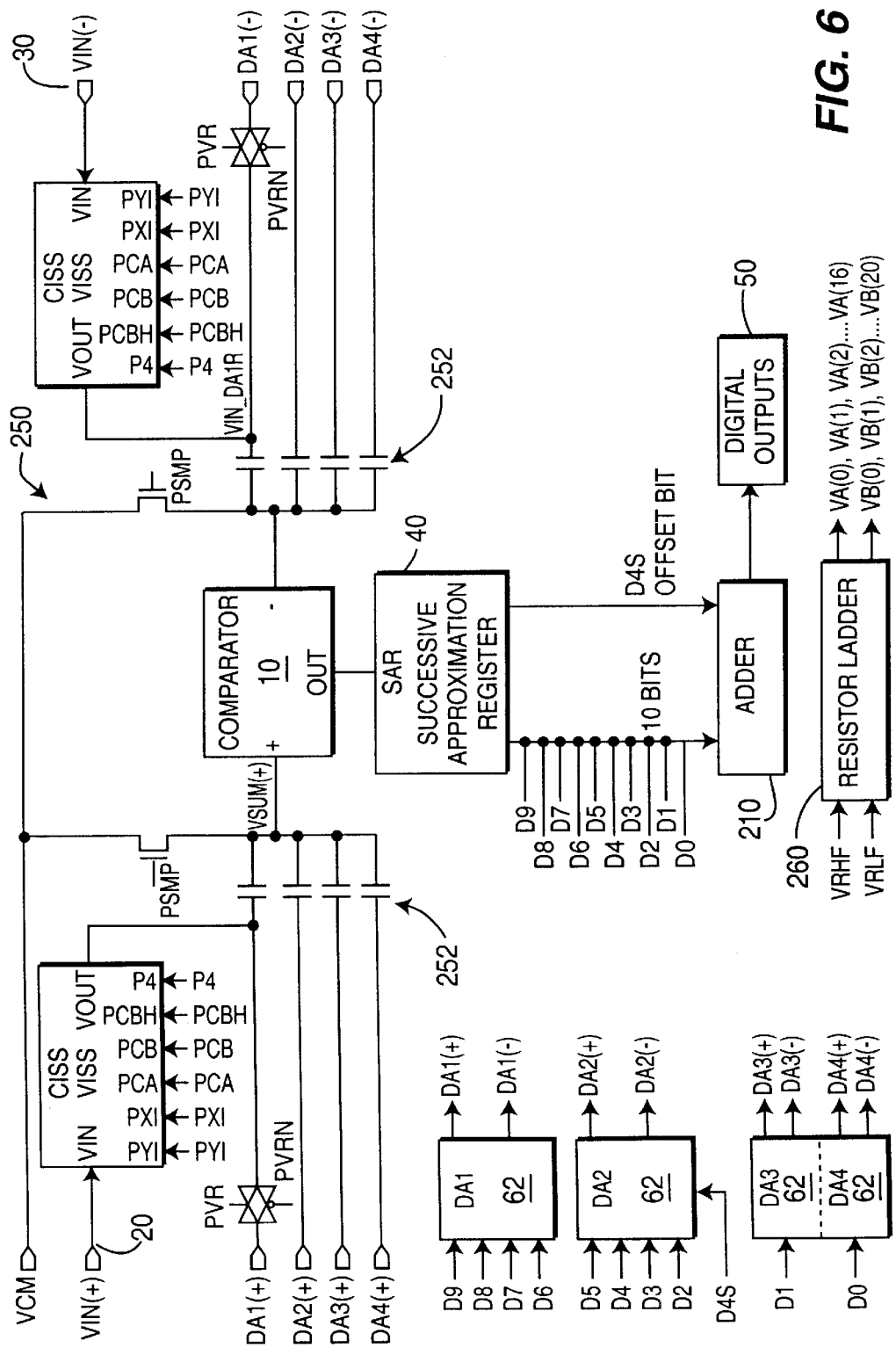
FIG. 6 illustrates a block diagram of a successive approximation analog-to-digital converter according to yet another aspect of the present invention.

Referring now also to FIG. 6, there is shown a 10-bit SSA ADC 250 according to yet another aspect of the present invention. Again, the ADC 250 generally includes comparator 10, (+) differential analog input 20, (−)differential analog input 30, SAR 40, adder 210 and digital outputs 50. In response to the comparator 10, SAR 40 provides a 10-bit digital code, having an MSB $D_9$, LSB $D_0$ and offset bit $D_{4S}$. Digital-to-analog conversion is performed by four DACs 62: $DA_1$, $DA_2$, $DA_3$ and $DA_4$. $DA_{1(+)}$ provides $DA_{1(+)}$ and $DA_{1(-)}$ using the four MSBs supplied by the SAR 40, i.e. $D_9$, $D_8$, $D_7$ and $D_6$. $DA_2$ provides $DA_{2(+)}$ and $DA_{2(-)}$ using the next four MSBs supplied by the SAR 40, i.e. $D_5$, $D_4$, $D_3$ and $D_2$, and the offset bit $D_{4S}$. $DA_3$ and $DA_4$ provide $DA_{3(+)}$, $DA_{3(-)}$ and $DA_{4(+)}$ and $DA_{4(-)}$ using the two LSBs supplied by the SAR 40, i.e. $D_1$, $D_0$. A resistor ladder 260 is provided and uses a reference voltage $V_{LHF}$ and span voltage $V_{RHF}$ to supply a plurality of voltages $Va_{(0-16)}$ and $Vb_{(0-20)}$ as will be described in greater detail with regard to FIG. 11. Still referring to FIG. 6, capacitors 252 serve to appropriately weight $DA_{1(+)}$, $DA_{2(+)}$, $DA_{3(+)}$, $DA_{4(+)}$, $DA_{1(-)}$, $DA_{2(-)}$, $DA_{3(-)}$, $DA_{4(-)}$ as they are supplied to the comparator 10. In the illustrated 10-bit SSA ADC of FIG. 6, if the capacitors 252 corresponding to $DA_{3(+)}$, $DA_{4(+)}$, $DA_{3(+)}$ and $DA_{3(-)}$ have a given capacitance C, the capacitors 252 corresponding to $DA_{2(+)}$ and $DA_{2(-)}$ should each have a capacitance four times the given value, or 4C while the capacitors 252 corresponding to $DA_{1(+)}$, and $DA_{1(-)}$ should each have a capacitance eight times the given value or 8C.

Referring now to FIG. 7A also, there is shown a circuit 255 for generating $DA_{(1+)}$. Generally, the circuit 255 includes a 4-to-16 decoder 270 which receives the four MSBs provided by the SAR 40 (FIG. 6), i.e. $D_9$, $D_8$, $D_7$ and $D_6$ and provides 16 pairs of outputs, $T_{(0-15)}$, $TN_{(0-15)}$ in response thereto. The circuit 255 further includes a plurality of switches 256 responsive to the pairs of signals T and TN output from the 4–16 decoder 270 to supply corresponding ones of supplied voltages $Va_0$–$Va_{16}$ as $DA_{1(+)}$. The following Table-1 illustrates which of the voltages $Va_{(0-15)}$ are provided responsively to $T_{(0-15)}$ and $TN_{(0-15)}$ by the switches 256.

TABLE 1

| | $DA_{1(+)}$ | |
|---|---|---|
| $Va_{(0-15)}$ | $T_{(0-15)}$ | $TN_{(0-15)}$ |
| 0 | 0 | 0 |
| 1 | 1 | 1 |
| 2 | 2 | 2 |
| 3 | 3 | 3 |
| 4 | 4 | 4 |
| 5 | 5 | 5 |
| 6 | 6 | 6 |
| 7 | 7 | 7 |
| 8 | 8 | 8 |
| 9 | 9 | 9 |
| 10 | 10 | 10 |
| 11 | 11 | 11 |
| 12 | 12 | 12 |
| 13 | 13 | 13 |
| 14 | 14 | 14 |
| 15 | 15 | 15 |

Thus, a first switch 256', uses signals $T_{(0)}$ and $TN_{(0)}$ to selectively supply voltage $Va_{(0)}$ as $DA_{1(+)}$.

Referring now also to FIG. 7B, there is shown a circuit 280 for generating signal $DA_{1(-)}$. The circuit 280 includes a plurality of switches 285 also responsive to the pairs of signals T and TN output from the 4–16 decoder 270 (FIG. 7A) to supply corresponding ones of voltages $Va_0$–$Va_{16}$ as $DA_{1(-)}$. The following Table-2 illustrates which of voltages $Va_{(0-15)}$ are provided responsively to $T_{(0-15)}$ and $TN_{(0-15)}$ by the switches 285.

TABLE 2

| | $DA_{1(-)}$ | |
|---|---|---|
| $Va_{(0-15)}$ | $T_{(0-15)}$ | $TN_{(0-15)}$ |
| 1 | 15 | 15 |
| 2 | 14 | 14 |
| 3 | 13 | 13 |
| 4 | 12 | 12 |
| 5 | 11 | 11 |
| 6 | 10 | 10 |
| 7 | 9 | 9 |
| 8 | 8 | 8 |
| 9 | 7 | 7 |
| 10 | 6 | 6 |
| 11 | 5 | 5 |
| 12 | 4 | 4 |
| 13 | 3 | 3 |
| 14 | 2 | 2 |
| 15 | 1 | 1 |
| 16 | 0 | 0 |

Thus one of the switches 280', uses signals $T_{(0)}$ and $TN_{(0)}$ to selectively supply voltage $Va_{(16)}$ as signal $DA_{1(-)}$.

Figures 8A, 8B:
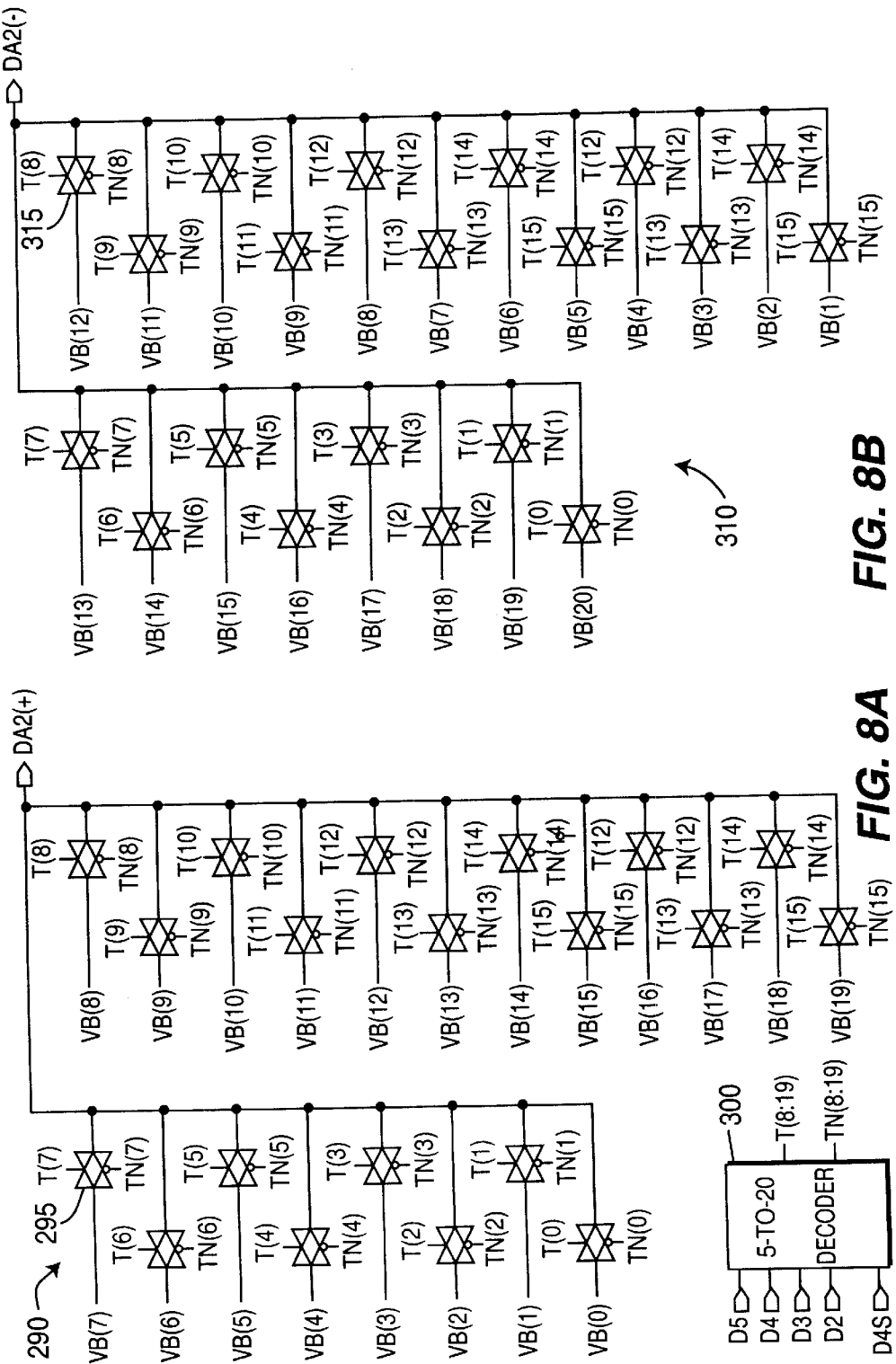
FIGS. 8A and 8B illustrate diagrams of circuits suitable for use as the digital-to-analog converter DA2 of FIG. 6 according to an aspect of the present invention.

Referring now to FIG. 8A, there is shown a circuit 290 for generating $DA_{2(+)}$. Generally, circuit 290 includes a 5-to-20 decoder 300 which receives the four next MSBs provided by the SAR 40 (FIG. 6), i.e. $D_5$, $D_4$, $D_3$ and $D_2$, as well as the offset bit $D_{4S}$, and provides 20 pairs of outputs, $T_{(0-19)}$, $TN_{(0-19)}$. The circuit 290 includes a plurality of switches 295 responsive to these pairs of signals T and TN output from the 5–20 decoder 300 to supply corresponding ones of voltages $Vb_0$–$Vb_{19}$ as $DA_{2(+)}$. The following Table-3 illustrates which of voltages $Vb_{(0-20)}$, are provided responsively to $T_{(0-19)}$ and $TN_{(0-19)}$ by the switches 295.

TABLE 3

| | $DA_{2(+)}$ | |
|---|---|---|
| $Vb_{(0-19)}$ | $T_{(0-19)}$ | $TN_{(0-19)}$ |
| 0 | 0 | 0 |
| 1 | 1 | 1 |
| 2 | 2 | 2 |
| 3 | 3 | 3 |
| 4 | 4 | 4 |
| 5 | 5 | 5 |
| 6 | 6 | 6 |
| 7 | 7 | 7 |
| 8 | 8 | 8 |
| 9 | 9 | 9 |
| 10 | 10 | 10 |
| 11 | 11 | 11 |
| 12 | 12 | 12 |
| 13 | 13 | 13 |
| 14 | 14 | 14 |
| 15 | 15 | 15 |
| 16 | 16 | 16 |
| 17 | 17 | 17 |
| 18 | 18 | 18 |
| 19 | 19 | 19 |

Thus, a first switch 295' uses signals $T_{(0)}$ and $TN_{(0)}$ to selectively supply voltage $Vb_{(0)}$ as $DA_{2(')}$.

Referring now to FIG. 8B, there is shown a circuit 310 for generating $DA_{2(-)}$. Generally, the circuit 310 includes a plurality of switches 315 responsive to these pairs of signals T and TN output from the 5–20 decoder 300 to supply corresponding ones of voltages $Vb_0$–$Vb_{20}$ as $DA_{2(-)}$. The following Table-4 illustrates which of voltages $Vb_{(0-19)}$ are provided as $DA_{2(-)}$ responsively to $T_{(0-19)}$ and $TN_{(0-19)}$ by the switches 315.

TABLE 4

| | $DA_{2(-)}$ | |
|---|---|---|
| $Vb_{(0-20)}$ | $T_{(0-19)}$ | $TN_{(0-19)}$ |
| 1 | 19 | 19 |
| 2 | 18 | 18 |
| 3 | 17 | 17 |
| 4 | 16 | 16 |
| 5 | 15 | 15 |
| 6 | 14 | 14 |
| 7 | 13 | 13 |
| 8 | 12 | 12 |
| 9 | 11 | 11 |
| 10 | 10 | 10 |
| 11 | 9 | 9 |
| 12 | 8 | 8 |
| 13 | 7 | 7 |
| 14 | 6 | 6 |
| 15 | 5 | 5 |
| 16 | 4 | 4 |
| 17 | 3 | 3 |
| 18 | 2 | 2 |
| 19 | 1 | 1 |
| 20 | 0 | 0 |

Thus, a switch 315' uses signals $T_{(0)}$ and $TN_{(0)}$ to selectively supply voltage $Vb_{(20)}$.

Figures 9A, 9B:
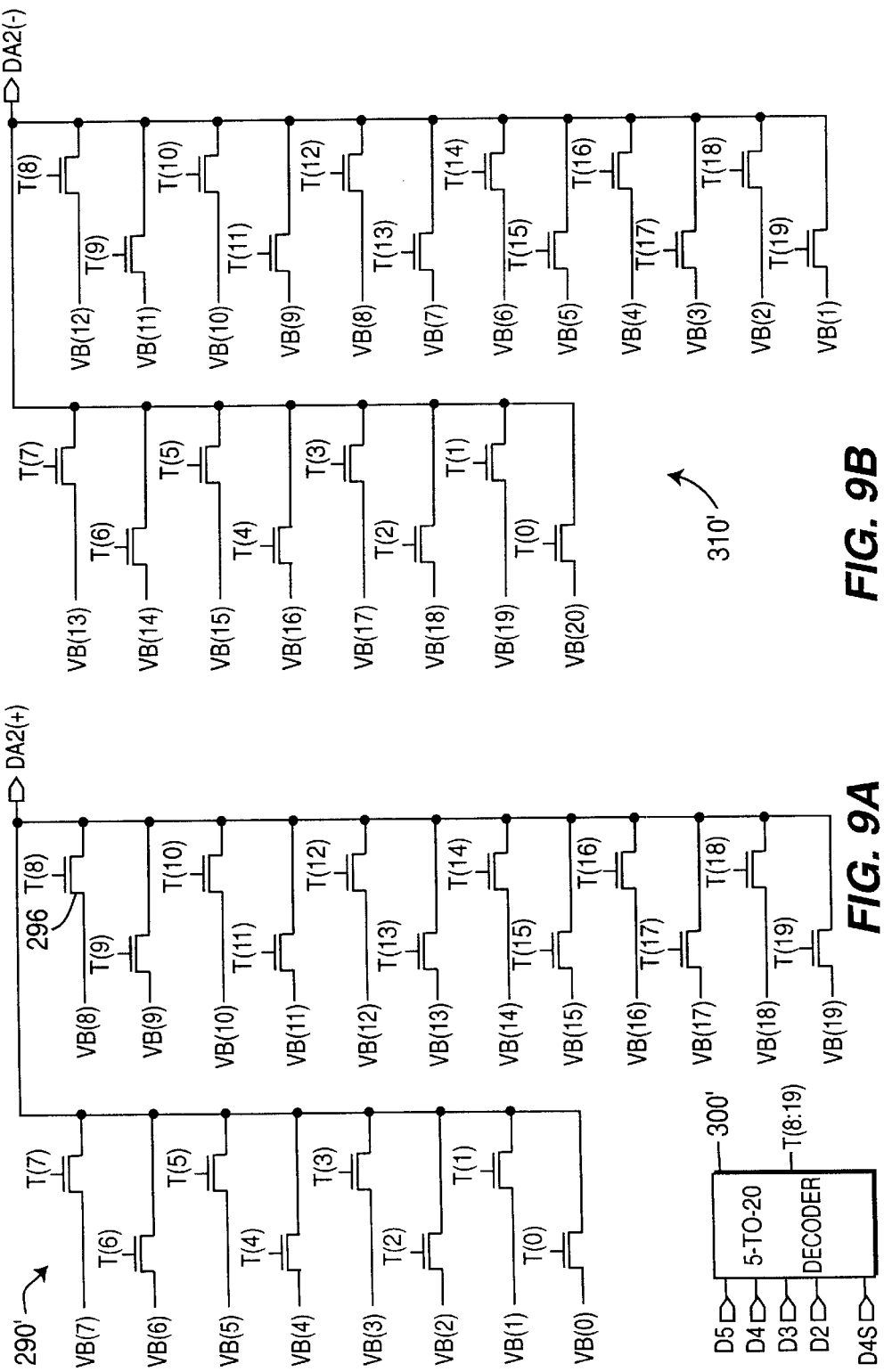
FIGS. 9A and 9B illustrate diagrams of alternative circuits suitable for use as the digital-to-analog converter DA2 of FIG. 6 according to another aspect of the present invention.

Referring now to FIGS. 9A and 9B, therein is illustrated circuits 290' and 310' according to another aspect of the present invention. Therein a 5–20 decoder 300' is used to provide signals $T_{(0-19)}$ in response to input of the next four MSBs, i.e. $D_5$, $D_4$, $D_3$ and $D_2$, and the offset bit $D_{4S}$. A plurality of transistors 296 are used to selectively provide voltages $Vb_{(0-19)}$ as $DA_{2(+)}$ and $DA_{2(-)}$ in response to $T_{(0-20)}$. The following Tables 5 and 6 show which ones of signals $T_{(0-20)}$ are used to selectively activate the transistors 296 to provide $DA_{2(+)}$ and $DA_{2(-)}$, respectively.

TABLE 5

| $DA_{2(+)}$ | |
|---|---|
| $Vb_{(0-19)}$ | $T_{(0-19)}$ |
| 1 | 1 |
| 2 | 2 |
| 3 | 3 |
| 4 | 4 |
| 5 | 5 |
| 6 | 6 |
| 7 | 7 |
| 8 | 8 |
| 9 | 9 |
| 10 | 10 |
| 11 | 11 |
| 12 | 12 |
| 13 | 13 |
| 14 | 14 |
| 15 | 15 |
| 16 | 16 |
| 17 | 17 |
| 18 | 18 |
| 19 | 19 |

TABLE 6

$DA_{2(-)}$

| $Vb_{(0-19)}$ | $T_{(0-19)}$ |
|---|---|
| 1 | 19 |
| 2 | 18 |
| 3 | 17 |
| 4 | 16 |
| 5 | 15 |
| 6 | 14 |
| 7 | 13 |
| 8 | 12 |
| 9 | 11 |
| 10 | 10 |
| 11 | 9 |
| 12 | 8 |
| 13 | 7 |
| 14 | 6 |
| 15 | 5 |
| 16 | 4 |
| 17 | 3 |
| 18 | 2 |
| 19 | 1 |
| 20 | 0 |

Figure 10A:
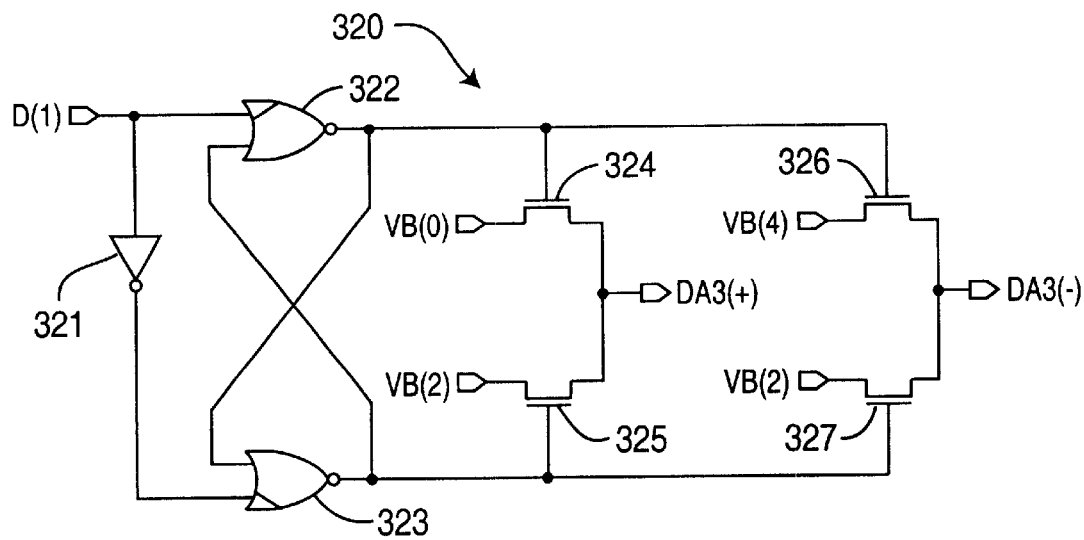
FIG. 10A illustrates a diagram of circuit suitable for use as the digital-to-analog converter DA3 of FIG. 6 according to an aspect of the present invention.

Referring now to FIG. 10A, there is shown a circuit 320 for providing $DA_{3(+)}$ and $DA_{3(-)}$. Still referring to FIG. 10A, the circuit 320 receives bit $D_1$ via an input. The input is coupled to an inverter 321 and a first input of a NOR gate 322. The inverter 321 outputs to a first input of a second NOR gate 323. The output of the NOR gate 322 is provided as a second input for NOR gate 323. Likewise, the output of NOR gate 323 is provided as a second input for NOR gate 322. In other words, the NOR gates 322, 323 are cross-coupled similarly as for a conventional S-R latch. The output of NOR gate 322 is also coupled to a gate input for a transistor 324 and a gate input for a transistor 326. The output of NOR gate 323 is coupled to a gate input of a transistor 325 and a gate input of a transistor 327. The transistor 324 is provided on a source input with $Vb_{(0)}$ and transistor 325 is provided on a source input with $Vb_{(2)}$. The drains of transistors 324 and 325 are coupled to a common node to provide $DA_{3(+)}$. Accordingly, $Vb_{(0)}$ and $Vb_{(2)}$ are selectively provided as $DA_{3(+)}$ dependently upon $D_1$. Similarly, transistor 326 is provided on a source input with $Vb_{(4)}$ and transistor 327 is provided on a source input with $Vb_{(2)}$. The drains of transistors 326 and 327 are coupled to a common node to provide $DA_{3(-)}$. Accordingly, $Vb_{(4)}$ and $Vb_{(2)}$ are selectively provided as $DA_{3(-)}$ dependently upon $D_1$.

Figure 10B:
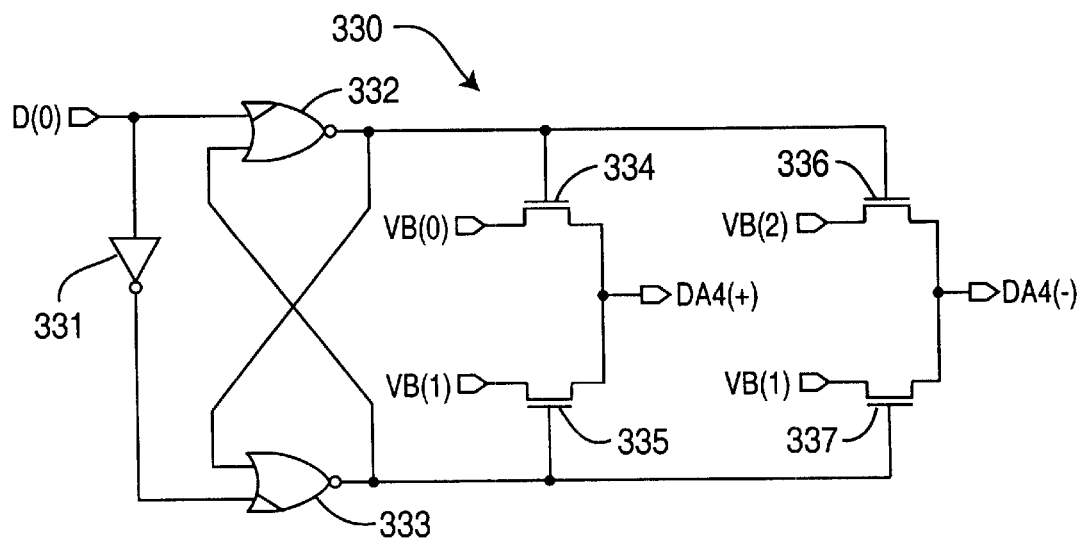
FIG. 10B illustrates a diagram of a circuit suitable for use as the digital-to-analog converter DA4 of FIG. 6 according to an aspect of the present invention; and, FIG. 11 illustrates a diagram of a circuit suitable for use as the resistor ladder of FIG. 6 according to an aspect of the present invention.

Referring now to FIG. 10B, there is shown a circuit 330 for providing $DA_{4(+)}$ and $DA_{4(31)}$. Still referring to FIG. 10B, the circuit 330 receives $D_0$ via an input. The input is coupled to an inverter 331 and a first input of a NOR gate 332. The inverter 331 outputs to a first input of a second NOR gate 333. The output of the NOR gate 332 is provided as a second input for NOR gate 333. Likewise, the output of NOR gate 333 is provided as a second input for NOR gate 332. In other words, the NOR gates 332, 333 are cross-coupled similarly as for a conventional S-R latch. The output of NOR gate 332 is coupled to a gate input for a transistor 334 and a gate input for a transistor 336. The output of NOR gate 333 is coupled to a gate input of a transistor 335 and a gate input of a transistor 337. The transistor 334 is provided on a source input with $Vb_{(0)}$ and transistor 335 is provided on a source input with $Vb_{(1)}$. The drains of transistors 334 and 335 are coupled to a common node to provide $DA_{4(+)}$. Accordingly, $Vb_{(0)}$ and $Vb_{(1)}$ are selectively provided as $DA_{4(+)}$ dependently upon $D_0$. Similarly, transistor 336 is provided on a source input with $Vb_{(2)}$ and transistor 337 is provided on a source input with $Vb_{(1)}$. The drains of transistors 336 and 337 are coupled to a common node to provide $DA_{4(-)}$. Accordingly, $Vb_{(2)}$ and $Vb_{(1)}$ are selectively provided as $DA_{4(-)}$ dependently upon $D_0$.

Figure 11:
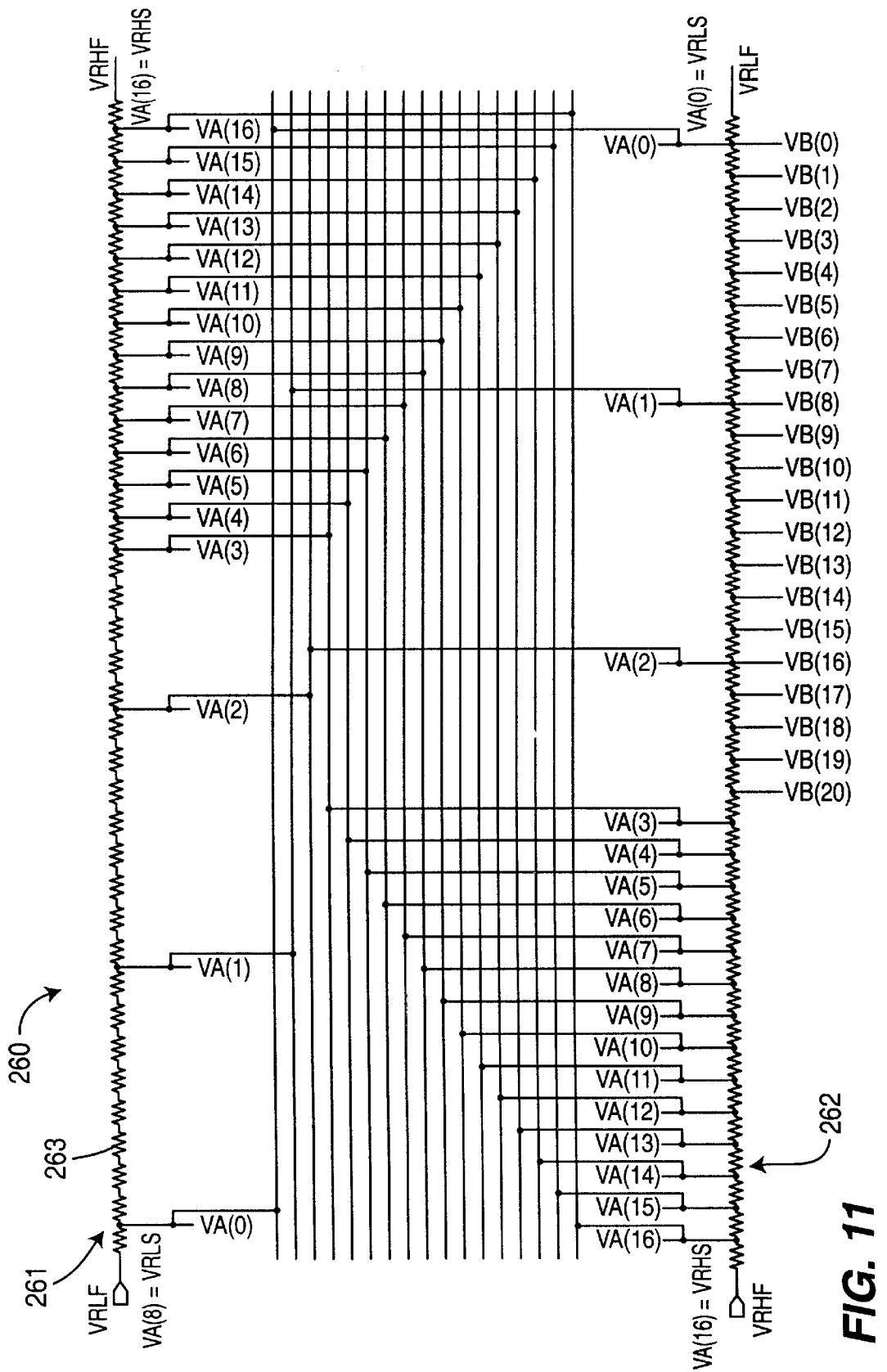

Referring finally to FIG. 11, there is shown the resistor ladder 260 discussed with regard to FIG. 6. The resistor ladder 260 provides the voltages $Va_{(0-16)}$ and $Vb_{(0-20)}$ as have been discussed. The resistor ladder 260 includes two serially-connected resistor ladders 261, 262. These ladders 261, 262 are cross-connected to reduce resistivity non-uniformity due to fabrication, for example. Each resistor ladder 261, 262, is divided into 16 main sections $Va_{(0-16)}$ by resistors 263. Between $Va_0$ and $Va_1$, each ladder is subdivided into 8 sections $Vb_{(0-8)}$. Between $Va_1$ and $Va_2$, each ladder is subdivided into another 8 sections $Vb_{(9-16)}$. Between $Va_2$ and $Va_3$, each ladder is subdivided into another 5 sections $Vb_{(17-20)}$. Each Vb section is $\frac{1}{128}$ of the full range for the analog signal input to an ADC utilizing the ladder 260. The resistors that make up the ladder 260 are preferably all about the same value, for example 1k ohm, within a degree of accuracy of about 1 ohm, for example.

Although the invention has been described and pictured in a preferred form with a certain degree of particularity, it is understood that the present disclosure of the preferred form, has been made only by way of example, and that numerous changes in the details of construction and combination and arrangement of parts may be made without departing from the spirit and scope of the invention as hereinafter claimed. It is intended that the patent shall cover by suitable expression in the appended claims, whatever features of patentable novelty exist in the invention disclosed.

What is claimed is:

1. A method for converting a plurality of input signals being indicative of a signal to be converted to a digital output comprising:
    setting a plurality of codes each being indicative of a corresponding reference level; and, for each one of said codes,
    converting said one code to a first analog signal, and summing said first analog signal with a first of said input signals to provide a first summed signal;
    complementing said one code to provide a complemented code, converting said complemented code to a second analog signal, and summing said second analog signal with a second of said input signals to provide a second summed signal corresponding to said first summed signal;
    comparing said corresponding first and second summed signals to provide a comparison signal; and,
    setting at least a portion of said digital output according to said comparison signal.

2. The method of claim 1, wherein said plurality of input signals are differential signals.

3. The method of claim 1, wherein said plurality of input signals are two differential input signals.

4. The method of claim 1, wherein one of said input signals is a reference signal.

5. The method of claim 1, wherein said complementing comprises selectively providing portions of said code to at least one digital-to-analog converter.

6. The method of claim 1, wherein said complementing comprises selectively providing portions of said code to a plurality of digital-to-analog converters.

7. The method of claim 1, wherein said setting said plurality of codes comprises sequentially setting a register with said plurality of codes.

8. The method of claim 7, wherein said register is a successive approximation register.

9. The method of claim 1, wherein said complementing is two's complementing.

10. The method of claim 1, wherein at least one same decoder is used for converting said code to said first analog signal and converting said complemented code to said second analog signal.

11. The method of claim 1, further comprising decomposing said code into a plurality of digital-to-analog converters.

12. The method of claim 1, further comprising decomposing said complemented code into a plurality of digital-to-analog converters.

13. A method for converting a plurality of input signals being indicative of a signal to be converted to a digital output, comprising:

setting a plurality of codes each being indicative of a corresponding reference level; and, for each one of said codes, converting said one code to a first analog signal, and summing said first analog signal with a first of said input signals to provide a first summed signal;

complementing said one code to provide a complemented code, converting said complemented code to a second analog signal, and summing said second analog signal with a second of said input signals to provide a second summed signal corresponding to said first summed signal;

comparing said corresponding first and second summed signals to provide a comparison signal; and, setting at least a portion of said digital output according to said comparison signal, wherein at least one same decoder is used for converting said code to said first analog signal and converting said complemented code to said second analog signal.

14. An analog to digital converter, comprising:

a comparator including a plurality of inputs and at least one output;

a register including an input and an output, said register input being coupled to said comparator output, and said register supplying a code at said register output corresponding to said comparator output;

circuitry for complementing said code to provide a complemented code;

at least one digital-to-analog converter coupled between said register output and at least one of said comparator inputs so as to receive said code and complemented code and provide analog signals corresponding to said code and complemented code; and at least one summing circuit at least partially responsive to said analog signal corresponding to said code or complemented code and to one of a plurality of differential input wherein said summing circuit subtracts said analog signal from said one of said differential inputs.

15. An analog to digital converter, comprising:

a comparator including a plurality of inputs and at least one output;

a register including an input and an output, said register input being coupled to said comparator output, and said register supplying a code at said register output corresponding to said comparator output;

circuitry for complementing said code to provide a complemented code;

at least one digital-to-analog converter coupled between said register output and at least one of said comparator inputs so as to receive said code and complemented code and provide analog signals corresponding to said code and complemented code; and a plurality of adders, wherein at least one of said adders is at least partially responsive to an output of one of said digital-to-analog converters corresponding to said code or complemented code.

* * * * *